(12) United States Patent
Wahlroos et al.

(10) Patent No.: US 8,044,666 B2
(45) Date of Patent: Oct. 25, 2011

(54) METHOD FOR DETERMINING LOCATION OF PHASE-TO EARTH FAULT

(75) Inventors: Ari Wahlroos, Vaasa (FI); Janne Altonen, Toijala (FI)

(73) Assignee: ABB Technology AG, Zurich (CH)

( * ) Notice: Subject to any disclaimer, the term of this patent is extended or adjusted under 35 U.S.C. 154(b) by 664 days.

(21) Appl. No.: 12/153,426

(22) Filed: May 19, 2008

(65) Prior Publication Data

US 2008/0284447 A1 Nov. 20, 2008

(30) Foreign Application Priority Data

May 18, 2007 (EP) .................................... 07108460

(51) Int. Cl.
*G01R 31/08* (2006.01)
(52) U.S. Cl. ....................... 324/522; 324/512
(58) Field of Classification Search .................. 324/522
See application file for complete search history.

(56) References Cited

U.S. PATENT DOCUMENTS

| | | | | |
|---|---|---|---|---|
| 3,593,124 | A | * | 7/1971 | Cahen et al. ............... 324/522 |
| 4,313,169 | A | * | 1/1982 | Takagi et al. ............... 702/59 |
| 4,906,937 | A | * | 3/1990 | Wikstrom et al. ........... 324/522 |
| 5,455,776 | A | * | 10/1995 | Novosel ...................... 702/59 |
| 7,171,322 | B2 | * | 1/2007 | Taylor ......................... 702/106 |
| 7,728,600 | B2 | * | 6/2010 | Wahlroos et al. ............ 324/509 |
| 2008/0297163 | A1 | * | 12/2008 | Wahlroos et al. ............ 324/522 |
| 2009/0267611 | A1 | * | 10/2009 | Wahlroos et al. ............ 324/522 |

FOREIGN PATENT DOCUMENTS

| | | |
|---|---|---|
| EP | 1 304 580 A2 | 4/2003 |
| EP | 1 724 597 A | 11/2006 |
| GB | 1140446 A | 1/1969 |
| GB | 1 539 118 A | 1/1979 |
| JP | 63-221266 A | 9/1983 |

OTHER PUBLICATIONS

European Search Report Dated Oct. 12, 2007.
Hanninen S: et al.: "Earth fault distance computation with fundamental frequency signals based on measurements in substation supply bay", 2002 Report No. VTT Research Notes 2153, XX002454683, Retrieved from the Internet: URL:htt://web.archieve.org/web/20061230171424/virtual.vtt.fi/inf/pdf/tiedotteet/2002/T2153.pdf.

* cited by examiner

*Primary Examiner* — Thomas Valone
(74) *Attorney, Agent, or Firm* — Buchanan Ingersoll & Rooney PC

(57) ABSTRACT

A method and apparatus for determining a location of a phase-to-earth fault on a three-phase electric line (30) of an electric network, comprising determining an equivalent load distance curve of the electric line (30) representing a voltage drop along the electric line scaled by an equivalent load distance of the electric line, determining a fault distance line indicating an estimate of a distance of the fault (F) from the measuring point (40) in relation to the equivalent load distance, determining a distance at which the equivalent load distance curve and the fault distance line intersect when superimposed, and selecting the determined distance as the distance between the measuring point (40) and the point of fault (F).

19 Claims, 4 Drawing Sheets

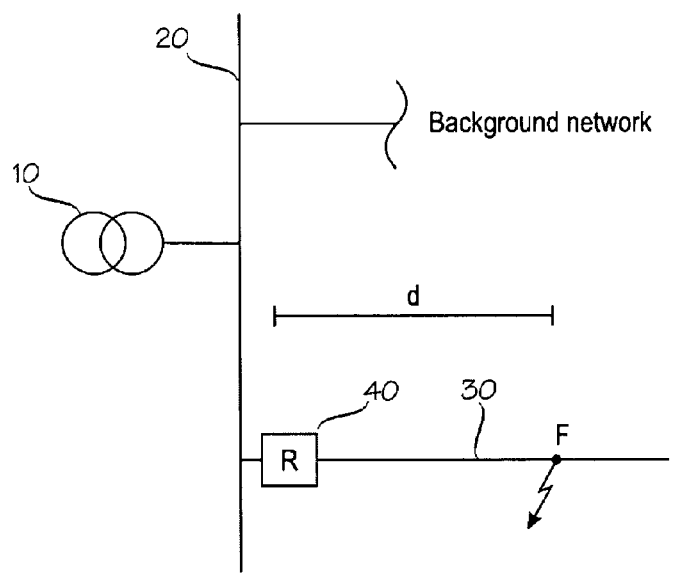
Fig. 1
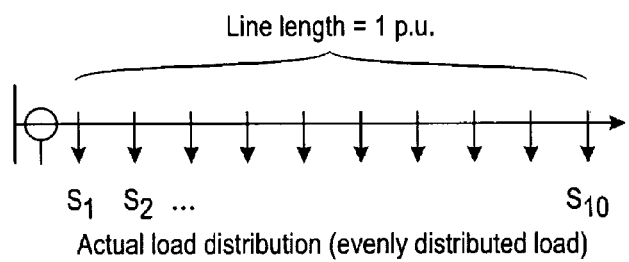
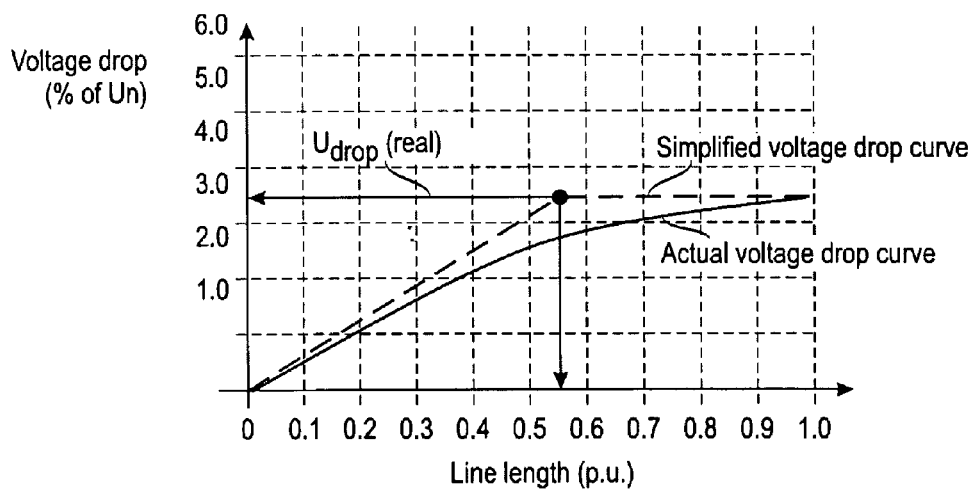
Fig. 2
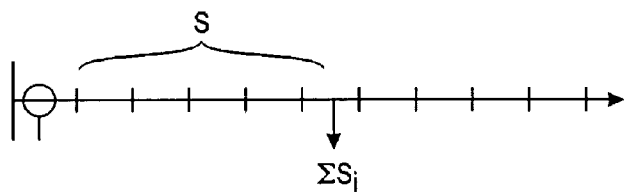

US 8,044,666 B2

METHOD FOR DETERMINING LOCATION OF PHASE-TO EARTH FAULT

FIELD OF THE INVENTION

The present invention relates to localization of single-phase earth faults in electric networks.

BACKGROUND OF THE INVENTION

Localization of earth faults is a challenging task. There are many factors which deteriorate the accuracy of a calculated fault location estimate, such as fault resistance and load. Distribution networks are especially challenging as they have specific features which further complicate and challenge fault localization algorithms. These include e.g. non-homogeneity of lines, presence of laterals and load taps.

Impedance-based fault location algorithms have become industry standard in modern microprocessor-based protection relays. The reason for their popularity is their easy implementation as they utilize the same signals as the other functions. Their performance has proven to be satisfactory in localizing short-circuit faults, but they are often not capable of localizing low current earth faults, i.e. earth faults in high impedance earthed systems. This is due to the fact that an earth fault in high impedance earthed networks differs fundamentally from a short circuit fault.

Document "Earth fault distance computation with fundamental frequency signals based on measurements in substation supply bay"; Seppo Hänninen, Matti Lehtonen; VTT Research Notes 2153; Espoo 2002, discloses an example of a method for fault localization of single phase earth faults in unearthed, Petersen coil compensated and low-resistance grounded networks. The disclosed method is based on measurements in a substation supply bay and it cannot therefore be optimally applied to feeder bays. Based on simulation results presented in the document, the performance of the algorithm is quite modest: with 2 MVA loading and 30 ohm fault resistance, the maximum error in 30 km line is −6.25 km i.e. −21%. With actual disturbance recordings one could expect even larger errors.

Prior art fault localization algorithms are typically based on an assumption that load is tapped to the end point of the electric line (e.g. a feeder), i.e. the fault is always assumed to be located in front of the load point. In real medium voltage feeders this assumption is rarely correct. In fact, due to voltage drop considerations, loads are typically located either at the beginning of the feeder or distributed more or less randomly over the entire feeder length. In such cases, the accuracy of prior art fault localization algorithms is impaired.

BRIEF DESCRIPTION OF THE INVENTION

An object of the present invention is to provide a method and an apparatus for implementing the method so as to overcome the above problems or at least to alleviate the problems. The objects of the invention are achieved by a method, a computer program product and an apparatus which are characterized by what is stated in the independent claims. The preferred embodiments of the invention are disclosed in the dependent claims.

The invention is based on the idea of determining the distance to a fault based on a voltage drop profile of the electric line and utilizing a concept of equivalent load distance which refers to a distance of an equivalent load point from the measuring point which equivalent load point equals to a total load of the electric line modelled to be concentrated in a single point of the electric line.

An advantage of the invention is that the accuracy of fault localization can be improved. More accurate fault location can be obtained due to realistic modeling of the loading of the electric line. In addition, the invention provides for an improved tolerance for load current.

BRIEF DESCRIPTION OF THE DRAWINGS

In the following the invention will be described in greater detail by means of preferred embodiments with reference to the accompanying drawings, in which FIG. 1 is a diagram illustrating an electric network in which the invention can be used;

FIG. 2 illustrates derivation of equivalent load distance according to an embodiment;

DETAILED DESCRIPTION OF THE INVENTION

Figure 3:
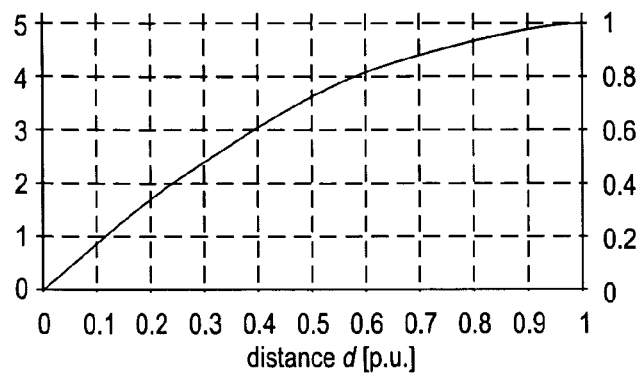
FIG. 3 is an example of a voltage drop curve of an electric line.

The application of the invention is not limited to any specific system, but it can be used in connection with various three-phase electric systems to determine a location of a phase-to-earth fault on a three-phase electric line of an electric network. The electric line can be a feeder, for example, and may be an overhead-line or a cable or a combination of both. The electric power system in which the invention is implemented can be an electric transmission or distribution network or a component thereof, for example, and may comprise several feeders. Moreover, the use of the invention is not limited to systems employing 50-Hz or 60-Hz fundamental frequencies or to any specific voltage level.

FIG. 1 is a simplified diagram illustrating an electric network in which the invention can be applied. The figure shows only the components necessary for understanding the invention. The exemplary network can be a medium voltage (e.g. 20 kV) distribution network fed through a substation comprising a transformer 10 and a busbar 20. The illustrated network also comprises electric line outlets, i.e. feeders, of which one 30 is shown separately. Other possible feeders as well as other network parts, except the line 30, are referred to as a 'background network'. The figure also shows a protective relay unit 40 at the beginning of line 30, and a point of earth fault F. The protective relay unit 40 may be located inside the substation. It should be noted that there may be any number of feeders or other network elements in the network. There may also be several feeding substations. Further, the invention can be utilized with a switching station without a transformer 10, for example. The network is a three-phase network although, for the sake of clarity, the phases are not shown in the figure. In the exemplary system of FIG. 1, the functionality of the invention can be located in the relay unit 40. It is also possible that only some measurements are performed at the location of unit 40 and the results are then transmitted to another unit or units in another location for further processing. In other words, unit 40 could be a mere measuring unit.

In the following, the three phases of the three-phase electricity system in which the invention is used are referred to as L1, L2, and L3. Monitored current and voltage values are preferably obtained by a suitable measuring arrangement including e.g. current and voltage transducers (not shown in the figures) connected to the phases of the electricity system. In most of the existing protection systems, these values are readily available and thus the implementation of the invention does not necessarily require any separate measuring arrangements. How these values are obtained is of no relevance to the basic idea of the invention and depends on the particular electricity system to be monitored. A phase-to-earth fault F on the three-phase electric line 30 and the corresponding faulted phase L1, L2, or L3 of the three-phase electric line of the electricity system to be monitored may be detected by e.g. a protective relay 40 associated with the electricity system. The particular way how the phase-to-earth fault is detected and the corresponding faulted phase is identified is of no relevance to the basic idea of the invention.

According to the invention the determination of the distance to a fault utilizes an equivalent load distance curve of the electric line, which is referred to as ELDC in the following. ELDC refers to a curve representing a voltage drop along the electric line in relation to a distance from the measuring point, which voltage drop is scaled by an equivalent load distance of the electric line. The equivalent load distance is referred to as ELD in the following. The concept of ELD, or parameter s, in turn indicates a distance of an equivalent load point from the measuring point, which equivalent load point equals to a total load of the electric line modelled to be concentrated in a single point of the electric line. In other words, the loading of the electric line is taken into account by modelling it, and the loading is preferably modelled with a fictitious single load tap located at distance s [0 . . . 1 p.u.] from the measuring point. Parameter s represents this ELD, which can be determined either by means of calculations or by means of measurements in primary network, as will be shown below in more detail.

FIG. 2 further visualizes the derivation and meaning of parameter s. In the illustrated exemplary case, the load is assumed to be evenly distributed along the electric line. In FIG. 2, the solid curve shows the actual voltage drop. The maximum value of the voltage drop is experienced at the end of the line and it is denoted by $U_{drop(real)}$. Now, if the whole load of this line were concentrated as a single load tap and located at distance s from the substation, the resulting maximum voltage drop would equal the actual maximum voltage drop $U_{drop(real)}$. The dashed curve in FIG. 2 shows the voltage drop when the total load is concentrated in a single load tap and located at distance s from the measuring point.

ELD can be determined by means of calculations. The calculation of the ELD (parameter s) can be based on calculating the resulting voltage drop along the electric line in two different loading conditions. Parameter s is the quotient of voltage drops in these two different loading conditions:

$$s = \frac{U_{drop(real)}}{U_{drop(s=1)}}$$

where $U_{drop(real)}$=the actual maximum voltage drop of the electric line $U_{drop(s=1)}$=a fictious voltage drop, if all load is tapped at the end of the electric line.

The actual maximum voltage drop, $U_{drop(real)}$, results from the actual load distribution at the furthest point of a radial feeder. The value can be obtained from a network calculation program, for example.

The fictious voltage drop, $U_{drop(s=1)}$, results when a load corresponding to the actual maximum voltage drop is tapped at a single point in the furthest point of the feeder. The voltage drop can be calculated with the following simple equation:

$$U_{drop(s=1)} = \frac{\text{abs}(Z_1 \cdot S)}{U^2} \cdot 100\%$$

where $Z_1$=positive sequence impedance from the measuring point to the point, where the voltage drop is at its maximum S=Total apparent load of the electric line (=P+j·Q)

P=Real part of the apparent load, real power

Q=Imaginary part of the apparent load, reactive power

U=Nominal voltage at the measuring point (phase-to-phase)

In the following an example is given on how the ELD can be calculated: in the example the total load of the electric line is S=1.430+j·0.265 MW (U=20.5 kV). The positive sequence impedance from the measuring point to the point where the voltage drop is at its maximum is: $Z_1$=12.778+j·12.871 ohm. The corresponding maximum voltage drop obtained from a network calculation program is $U_{drop(real)}$=3.61%. The fictious voltage drop corresponding to the situation where the total load would be located at a single point at the end of the line can be calculated as follows:

$$U_{drop(s=1)} = \frac{\text{abs}(Z_1 \cdot S)}{U^2} \cdot 100\% = 6.28\%$$

Using the equation (eq 15), the ELD value is:

$$s = \frac{U_{drop(real)}}{U_{drop(s=1)}} = \frac{3.61\%}{6.28\%} = 0.5748$$

ELD can alternatively be determined by means of measurements. The measurement of parameter s can be conducted by making a single-phase earth fault ($R_F$=0 ohm) at the furthest point of the electric line (d=1), where the maximum actual voltage drop takes place. The parameter s can be calculated using equation Eq. 2a or Eq. 2b below derived from the equivalent scheme illustrated in FIG. 5 and setting d=1.

In practice, the loading varies in time and place and thus the value of s is never totally constant. There is also a slight variation of s between phases, as loading of different phases is in practice never perfectly balanced. The determination of s is therefore preferably done in different loading scenarios, so that the variation of s can be evaluated. The value that represents the most typical loading condition should preferably be used as a value for s.

As explained already above, the equivalent load distance curve or ELDC refers to a curve representing a voltage drop along the electric line in relation to a distance from the measuring point which voltage drop is scaled by an ELD of the electric line. The ELDC of the electric line can be determined in several alternative ways. According to an embodiment, the ELDC of the electric line can be determined by first determining a voltage drop curve of the electric line which indicates a voltage drop on the electric line in relation to a distance from the measuring point, then determining the ELD of the electric line, and finally determining the ELDC by multiplying the voltage drop curve with the ELD. This is explained in more detail in the following:

The voltage drop curve can be derived using either network calculation programs, such as DMS600/Opera by ABB Group, or by hand calculation. Simple hand calculation example can be found for example in "Electric Power Systems", 3rd Edition, B. M. Weedy, pages 211-213. As an example, one such curve is illustrated in FIG. 3, where the voltage drop is calculated along the electric line in 0.1 per unit (p.u.) steps from 0.0 to 1.0 p.u. It should be noted that more or fewer steps could be used instead. The curve is then preferably scaled into p.u.-form using the maximum voltage drop value. This makes the curve independent of actual load magnitude. The p.u.-form voltage drop curve is valid regardless of actual load magnitude as long as the load distribution does not change. The number values are:

Voltage drop [%]=[0.00 0.90 1.80 2.30 3.00 3.70 4.10 4.30 4.60 4.90 5.00]

Voltage drop $[p.u.]$=[0.00 0.18 0.36 0.46 0.60 0.74 0.82 0.86 0.92 0.98 1.00]

Distance d $[p.u.]$=[0.00 0.10 0.20 0.30 0.40 0.50 0.60 0.70 0.80 0.90 1.00]

The shape of the voltage drop curve in FIG. 3 illustrates evenly distributed load in a radial feeder. In practice, the shape of the voltage drop curve depends on the actual load flow (location of loads) in the electric line.

After the per unit voltage drop curve is calculated with sufficient accuracy (the accuracy increases as the number of points used in the curve is increased), the curve is scaled into an ELDC. This is done by multiplying the per unit voltage drop curve by the value of ELD. In this example case s equals 0.52. The data points of per unit voltage drop curve are scaled as follows:

Voltage drop scaled=Voltage drop$[p.u.]*s$

Voltage drop scaled=[0.00 0.09 0.19 0.24 0.31 0.38 0.43 0.45 0.48 0.51 0.52]

Figure 4:
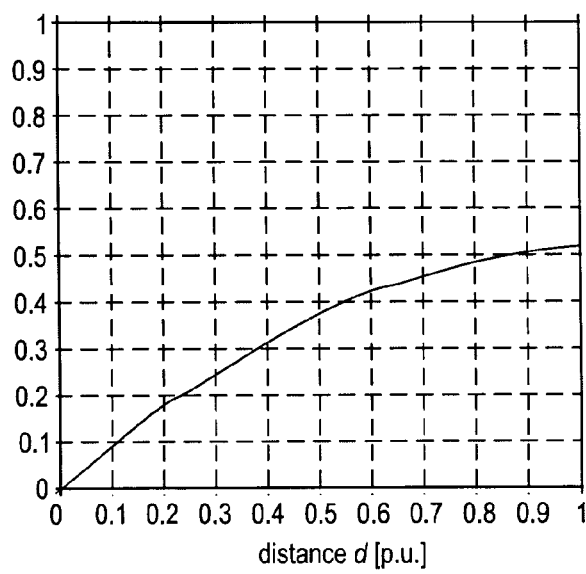
FIG. 4 is an example of an equivalent load distance curve of an electric line.

The resulting ELDC is illustrated in FIG. 4. The resulting domain is denoted as (d, s)-domain within this document.

Figure 8:
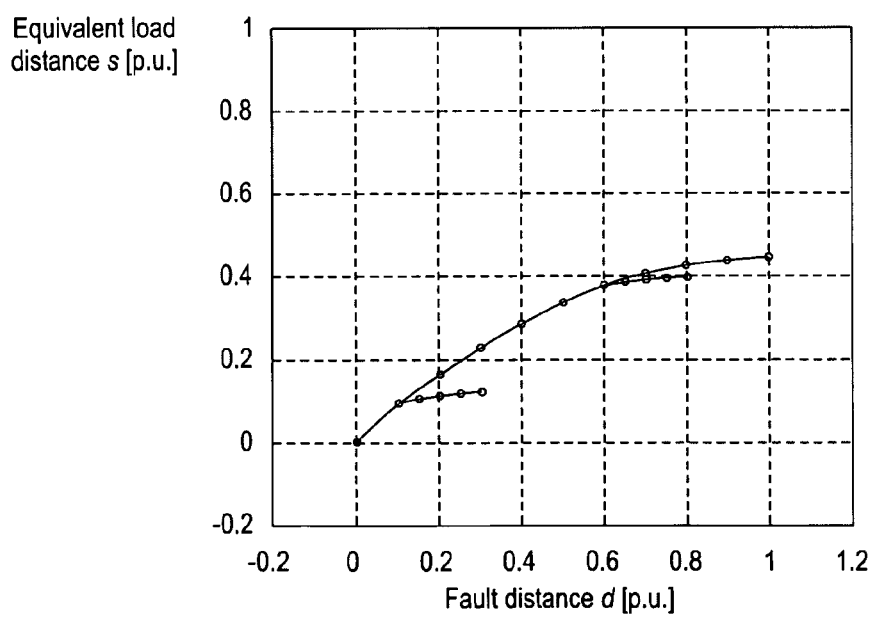
FIG. 8 is an example of an equivalent load distance curve of an electric line with branches.

In case the electric line has laterals (branches), then these can be taken into account by determining the ELDC such that it also includes the laterals. In other words, the ELDC comprises a branch for each lateral of the electric line. FIG. 8 shows an example of an ELDC corresponding to an electric line with two laterals.

An ELDC for an electric line comprising laterals can be determined e.g. in the following way: First voltage drops are determined for main branch and laterals. Then the data is sorted by ascending voltage drops and the ELDC is determined based on the data. The ELDC with main branch and laterals can be plotted.

The determination of ELDC of the electric line can take place in advance before an actual fault has occurred or during a fault or even after a fault has occurred. This has no significance to the basic idea of the invention. Since the shape of the ELDC depends on the load distribution of the electric line, it changes in the course of time if the load distribution changes. This is usually the case in practical situations. Thus, it is preferable to re-determine the ELDC periodically or after significant changes in the load distribution. Also load forecasting/estimation could be used in determining if or when the ELDC should be updated. The ELDC should be determined using healthy state or corresponding values of the system quantities. Thus, if the ELDC is determined during a fault, when healthy state values cannot be measured, values that have occurred before the fault can be used, for example. It is also possible to use forecasted healthy state values of the system quantities for determining the ELDC during a fault. In other words, when a fault occurs, it is possible to obtain forecasted probable healthy state values for network quantities for the time period during the fault, e.g. from a suitable network calculation program, and use such forecasted values for determining the ELDC. Such forecasted values could also be used e.g. if the ELDC is determined before the time period during which it will be used.

According to another embodiment, the determination of the ELDC of the electric line can be performed by conducting an earth fault test [$R_F$ preferably 0 ohm] at a known fault distance d from the measuring point and then calculating the corresponding ELD, i.e. s-parameter, value with an equation which relates the monitored current and voltage quantities during the earth fault test to the ELD. Such an equation can be derived from the symmetrical component equivalent circuit illustrated in FIG. 5.

Figure 5:
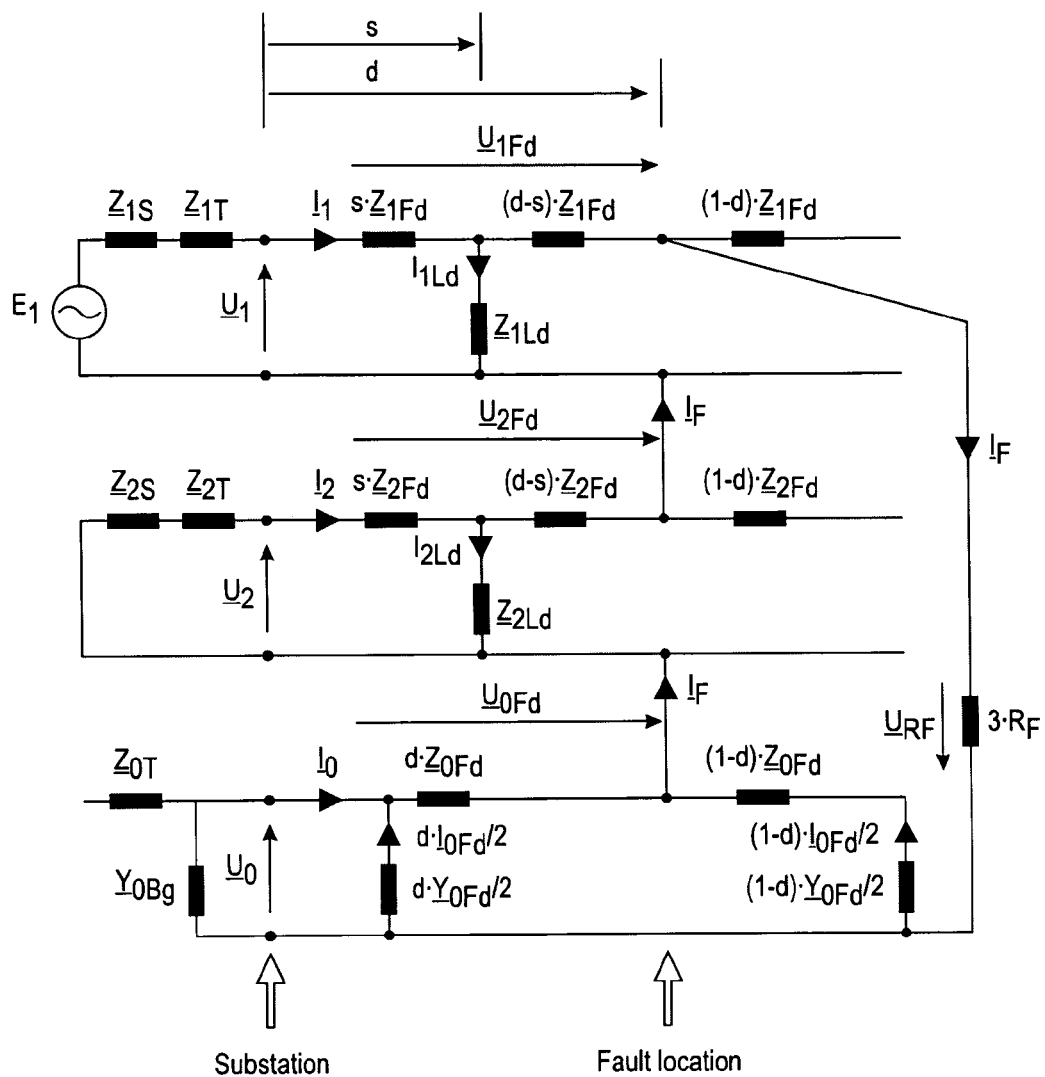
FIG. 5 is a symmetrical component equivalent scheme for single-phase earth fault on an electric line.

FIG. 5 illustrates a symmetrical component equivalent circuit for a single phase-to-earth fault, where load is located at distance s from the measuring point (substation in the example) and fault is located at distance d from the measuring point. Notations used in FIG. 5:

$\overline{Z}_{1S}$=Positive sequence source impedance.
$\overline{Z}_{1T}$=Positive sequence impedance of the main transformer.
$\overline{d}$=Per unit fault distance (d=0 . . . 1).
s=Per unit distance of the equivalent load tap.
$\overline{Z}_{1Fd}$=Positive sequence impedance of the electric line per phase.
$\overline{Z}_{1Ld}$=Positive sequence impedance of the load per phase.
$\overline{Z}_{2S}$=Negative sequence source impedance.
$\overline{Z}_{2T}$=Negative sequence impedance of the main transformer.
$\overline{Z}_{2Fd}$=Negative sequence impedance of the electric line per phase.
$\overline{Z}_{2Ld}$=Negative sequence impedance of the load per phase.
$\overline{Z}_{0T}$=Zero sequence impedance of the main transformer.
$\overline{Y}_{0Bg}$=Phase-to-earth admittance of the background network per phase.
$\overline{Z}_{0Fd}$=Zero sequence impedance of the electric line per phase.
$\overline{Y}_{0Fd}$=Phase-to-earth admittance of the electric line per phase.
$R_F$=Fault resistance.
$\overline{I}_1$=Positive sequence current measured at the measuring point.
$\overline{I}_{1Ld}$=Positive sequence load current.
$\overline{I}_F$=Fault component current at fault location.
$\overline{I}_2$=Negative sequence current measured at the measuring point.
$\overline{I}_{2Ld}$=Negative sequence load current.
$\overline{I}_0$=Zero sequence current measured at the measuring point.
$\overline{I}_{0Fd}$=Zero sequence charging current of the electric line itself.
$\overline{U}_1$=Positive sequence voltage measured at the measuring point.
$\overline{U}_2$=Negative sequence voltage measured at the measuring point.
$\overline{U}_0$=Zero sequence voltage measured at the measuring point.

Based on the equivalent scheme illustrated in FIG. 5, the following equation can be written ($\underline{U}_L$=faulted phase voltage):

$$\underline{U}_0+\underline{U}_1+\underline{U}_2=\underline{U}_L=\underline{U}_{0Fd}+\underline{U}_{1Fd}+\underline{U}_{2Fd}+\underline{U}_{RF}=\ldots s\cdot\underline{Z}_{1Fd}\cdot \underline{I}_1+\overline{(d-s)}\cdot\underline{Z}_{1Fd}\cdot\underline{I}_F+s\cdot\underline{Z}_{2Fd}\cdot\underline{I}_2+(d-s)\cdot\underline{Z}_{2Fd}\cdot\underline{I}_F+\ldots d\cdot \underline{Z}_{0Fd}\cdot(\underline{I}_0+\overline{d}\cdot\underline{I}_{0Fd}/2)+\overline{3}\cdot R_F\cdot\underline{I}_F \quad (\text{Eq. 1})$$

Parameter s can be solved from Eq. 1 at a known fault distance d from the measuring point by using the real and imaginary components:

Assuming, that the term $\underline{I}_{0Fd}/2$ in Eq. 1 is dependent on d: (Eq. 2a)

$$s(d)=-0.5*(2*re(\underline{I}_F)*im(\underline{U}_L)+2*im(\underline{I}_F)*re(\underline{Z}_{2Fd}*\underline{I}_F)*d-2*re(\underline{I}_F)*im(\underline{Z}_{1Fd}*\underline{I}_F)*d+2*im(\underline{I}_F)*d*re(\underline{Z}_{0Fd}*\underline{I}_0)+im(\underline{I}_F)*d^{\wedge}2*re(\underline{Z}_{0Fd}*\underline{I}_{0Fd})-2*re(\underline{I}_F)*im(\underline{Z}_{2Fd}*\underline{I}_F)*d-2*re(\underline{I}_F)*d*im(\underline{Z}_{0Fd}*\underline{I}_0)-1*re(\underline{I}_F)*d^{\wedge}2*im(\underline{Z}_{0Fd}*\underline{I}_{0Fd})-2*im(\underline{I}_F)*re(\underline{U}_L)+2*im(\underline{I}_F)*re(\underline{Z}_{1Fd}*\underline{I}_F)*d)/(-1*re(\underline{I}_F)*im(\underline{Z}_{1Fd}*\underline{I}_1)+re(\underline{I}_F)*im(\underline{Z}_{1Fd}*\underline{I}_F)-1*re(\underline{I}_F)*im(\underline{Z}_{2Fd}*\underline{I}_2)+re(\underline{I}_F)*im(\underline{Z}_{2Fd}*\underline{I}_F)+im(\underline{I}_F)*re(\underline{Z}_{1Fd}*\underline{I}_1)-1*im(\underline{I}_F)*re(\underline{Z}_{1Fd}*\underline{I}_F)+im(\underline{I}_F)*re(\underline{Z}_{2Fd}*\underline{I}_2)-1*im(\underline{I}_F)*re(\underline{Z}_{2Fd}*\underline{I}_F))$$

or

Assuming, that the term $\underline{I}_{0Fd}/2$ in Eq. 1 is independent on d: (Eq. 2b)

$$s(d)=0.5*(2*re(\underline{I}_F)*im(\underline{U}_L)+2*im(\underline{I}_F)*re(\underline{Z}_{2Fd}*\underline{I}_F)*d-2*re(\underline{I}_F)*im(\underline{Z}_{1Fd}*\underline{I}_F)*d+2*im(\underline{I}_F)*d*re(\underline{Z}_{0Fd}*\underline{I}_0)+im(\underline{I}_F)*d*re(\underline{Z}_{0Fd}*\underline{I}_{0Fd})-2*re(\underline{I}_F)*im(\underline{Z}_{2Fd}*\underline{I}_F)*d-2*re(\underline{I}_F)*d*im(\underline{Z}_{0Fd}*\underline{I}_0)-1*re(\underline{I}_F)*d*im(\underline{Z}_{0Fd}*\underline{I}_{0Fd})-2*im(\underline{I}_F)*re(\underline{U}_L)+2*im(\underline{I}_F)*re(\underline{Z}_{1Fd}*\underline{I}_F)*d)/(re(\underline{I}_F)*im(\underline{Z}_{1Fd}*\underline{I}_1)-1*re(\underline{I}_F)*im(\underline{Z}_{1Fd}*\underline{I}_F)+re(\underline{I}_F)*im(\underline{Z}_{2Fd}*\underline{I}_2)-1*re(\underline{I}_F)*im(\underline{Z}_{2Fd}*\underline{I}_F)-1*im(\underline{I}_F)*re(\underline{Z}_{1Fd}*\underline{I}_1)+im(\underline{I}_F)*re(\underline{Z}_{1Fd}*\underline{I}_F)-1*im(\underline{I}_F)*re(\underline{Z}_{2Fd}*\underline{I}_2)+im(\underline{I}_F)*re(\underline{Z}_{2Fd}*\underline{I}_F))$$

The pair of the known fault distance and the determined corresponding ELD defines a point of the ELDC in (d,s)-domain. By conducting such tests in two or more different distances from the measuring point, the ELDC for the feeder can be composed from the set of points obtained. The test should be conducted preferably in several locations in order to get more points and thus a more accurate ELDC.

The fault distance calculation proceeds by determining a fault distance line that indicates an estimate of a distance of the fault from the measuring point in relation to the ELD on the basis of values of the monitored current and voltage quantities during a detected phase-to-earth fault and an equation that relates the monitored current and voltage quantities to the fault distance. The fault distance line is preferably determined as follows:

The co-ordinates for the fault distance line representing the fault location estimate are preferably derived from Eq. 1 by inserting: s=0 (the equivalent load tap is located at the beginning of the feeder at distance 0.0 p.u.) and s=1 (the equivalent load tap is located in the end of the feeder at distance 1.0 p.u.). The fault location estimate can be calculated assuming either, that the term $I_{0Fd}/2$ in Eq. 1 is dependent on or independent of d:

Assuming, that the term $I_{0Fd}/2$ in Eq. 1 is dependent on d:

$$\underline{A}=re(\underline{Z}_{0Fd}*\underline{I}_{0Fd})*im(\underline{I}_F)+im(\underline{Z}_{0Fd}*\underline{I}_{0Fd})*re(\underline{I}_F)$$

$$\underline{B}=(-2*re(\underline{Z}_{2Fd}*\underline{I}_F)*im(\underline{I}_F)-2*re(\underline{Z}_{0Fd}*\underline{I}_0)*im(\underline{I}_F)+2*im(\underline{Z}_{0Fd}*\underline{I}_0)*re(\underline{I}_F)-2*im(\underline{I}_F)*re(\underline{Z}_{1Fd}*\underline{I}_F)+2*re(\underline{I}_F)*im(\underline{Z}_{1Fd}*\underline{I}_F)+2*im(\underline{Z}_{2Fd}*\underline{I}_F)*re(\underline{I}_F))$$

$$\underline{C}=2*im(\underline{I}_F)*re(\underline{U}_L)-2*re(\underline{I}_F)*im(\underline{U}_L)$$

$$d1(s=0)=(-\underline{B}+sqrt(\underline{B}*\underline{B}-4*\underline{A}*\underline{C}))/(2*\underline{A}) \quad (\text{Eq. 3a})$$

$$d2(s=0)=(-\underline{B}-sqrt(\underline{B}*\underline{B}-4*\underline{A}*\underline{C}))/(2*\underline{A}) \quad (\text{Eq. 3b})$$

The valid estimate value for fault distance d(s=0) is either d1 or d2, such that 0<d(s=0)<1 (in practice some error margin may be needed).

$$\underline{A}=-im(\underline{I}_F)*re(\underline{Z}_{0Fd}*\underline{I}_{0Fd})+im(\underline{Z}_{0Fd}*\underline{I}_{0Fd})*re(\underline{I}_F)$$

$$\underline{B}=-2*im(\underline{I}_F)*re(\underline{Z}_{0Fd}*\underline{I}_0)+2*re(\underline{I}_F)*im(\underline{Z}_{1Fd}*\underline{I}_F)+2*re(\underline{I}_F)*im(\underline{Z}_{0Fd}*\underline{I}_0)-2*im(\underline{I}_F)*re(\underline{Z}_{2Fd}*\underline{I}_F)+2*im(\underline{Z}_{2Fd}*\underline{I}_F)*re(\underline{I}_F)-2*im(\underline{I}_F)*re(\underline{Z}_{1Fd}*\underline{I}_F)$$

$$\underline{C}=2*im(\underline{I}_F)*re(\underline{U}_L)-2*im(\underline{I}_F)*re(\underline{Z}_{1Fd}*\underline{I}_1)-2*im(\underline{Z}_{2Fd}*\underline{I}_F)*re(\underline{I}_F)+2*im(\underline{I}_F)*re(\underline{Z}_{1Fd}*\underline{I}_F)-2*im(\underline{I}_F)*re(\underline{Z}_{2Fd}*\underline{I}_2)-2*re(\underline{I}_F)*im(\underline{U}_L)+2*im(\underline{I}_F)*re(\underline{Z}_{2Fd}*\underline{I}_F)-2*re(IF)*im(\underline{Z}_{1Fd}*\underline{I}_F)+2*im(\underline{Z}_{2Fd}*\underline{I}_2)*re(IF)+2*im(\underline{Z}_{1Fd}*\underline{I}_1)*re(\underline{I}_F)$$

$$d1(s=1)=(-\underline{B}+sqrt(\underline{B}*\underline{B}-4*\underline{A}*\underline{C}))/(2*\underline{A}) \quad (\text{Eq. 4a})$$

$$d2(s=1)=(-\underline{B}-sqrt(\underline{B}*\underline{B}-4*\underline{A}*\underline{C}))/(2*\underline{A}) \quad (\text{Eq. 4b})$$

The valid estimate value for fault distance d(s=1) is either d1 or d2, such that 0<d(s=1)<1 (in practice some error margin may be needed).

Alternatively, assuming that the term $\underline{I}_{0Fd}/2$ in Eq. 1 is independent of d:

$$d(s=0)=2*(-1.*re(\underline{I}_F)*im(\underline{U}_L)+im(\underline{I}_F)*re(\underline{U}_L))/(-2*re(\underline{I}_F)*im(\underline{Z}_{1Fd}*\underline{I}_F)-2*re(\underline{I}_F)*im(\underline{Z}_{2Fd}*\underline{I}_F)-2*re(\underline{I}_F)*im(\underline{Z}_{0Fd}*\underline{I}_0)-1*re(\underline{I}_F)*im(\underline{Z}_{0Fd}*\underline{I}_{0Fd})+2*im(\underline{I}_F)*re(\underline{Z}_{1Fd}*\underline{I}_F)+2*im(\underline{I}_F)*re(\underline{Z}_{2Fd}*\underline{I}_F)+2*im(\underline{I}_F)*re(\underline{Z}_{0Fd}*\underline{I}_0)+im(\underline{I}_F)*re(\underline{Z}_{0Fd}*\underline{I}_{0Fd})) \quad (\text{Eq. 5})$$

$$d(s=1)=-2*(re(\underline{I}_F)*im(\underline{U}_L)-1*re(\underline{I}_F)*im(\underline{Z}_{1Fd}*\underline{I}_1)-1*im(\underline{I}_F)*re(\underline{Z}_{2Fd}*\underline{I}_F)+re(\underline{I}_F)*im(\underline{Z}_{1Fd}*\underline{I}_F)-1*re(\underline{I}_F)*im(\underline{Z}_{2Fd}*\underline{I}_2)-1*im(\underline{I}_F)*re(\underline{U}_L)+re(\underline{I}_F)*im(\underline{Z}_{2Fd}*\underline{I}_F)-1*im(\underline{I}_F)*re(\underline{Z}_{1Fd}*\underline{I}_F)+im(\underline{I}_F)*re(\underline{Z}_{2Fd}*\underline{I}_2)+im(\underline{I}_F)*re(\underline{Z}_{1Fd}*\underline{I}_1))/(-2*re(\underline{I}_F)*im(\underline{Z}_{1Fd}*\underline{I}_F)-2*re(\underline{I}_F)*im(\underline{Z}_{2Fd}*\underline{I}_F)-2*re(\underline{I}_F)*im(\underline{Z}_{0Fd}*\underline{I}_0)-1*re(\underline{I}_F)*im(\underline{Z}_{0Fd}*\underline{I}_{0Fd})+2*im(\underline{I}_F)*re(\underline{Z}_{1Fd}*\underline{I}_F)+2*im(\underline{I}_F)*re(\underline{Z}_{2Fd}*\underline{I}_F)+2*im(\underline{I}_F)*re(\underline{Z}_{0Fd}*\underline{I}_0)+im(\underline{I}_F)*re(\underline{Z}_{0Fd}*\underline{I}_{0Fd})) \quad (\text{Eq. 6})$$

According to an embodiment of the invention, current and voltage variables are preferably selected as follows:

$\underline{U}_L$=faulted phase voltage $\underline{I}_1$=positive sequence current component=$(\underline{I}_{L1}+a\cdot\underline{I}_{L2}+a^2\cdot\underline{I}_{L3})/3$ $\underline{I}_2$=negative sequence current component=$(\underline{I}_{L1}+a^2\cdot\underline{I}_{L2}+a\cdot\underline{I}_{L3})/3$ $\underline{I}_0$=zero sequence current component=$(\underline{I}_{L1}+\underline{I}_{L2}+\underline{I}_{L3})/3$ $\underline{I}_F=\underline{K}_1\cdot\underline{I}_0$ or alternatively $\underline{I}_F=\underline{I}_2$ $\underline{I}_{0Fd}=(\underline{K}_1-1)\cdot\underline{I}_0$ or alternatively $\underline{I}_{0Fd}=(\underline{I}_2-\underline{I}_0)$ where $a=\cos(120°)+j\cdot\sin(120°)$ $\underline{K}_1$=current distribution factor.

The current distribution factor $\underline{K}_1$ can be calculated with the following equation:

$$K_1 = \frac{\underline{Y}_{0F} + \underline{Y}_{0BG}}{\underline{Y}_{0BG}} = \frac{\underline{Y}_{0TOT}}{\underline{Y}_{0BG}} \quad (\text{Eq. 7})$$

where $\underline{Y}_{0F}$=Apparent zero-sequence admittance of the electric line $\underline{Y}_{0BG}$=Apparent zero-sequence admittance of the background network.

$Y_{OF}$ can be determined using predetermined conductor data:

$$\underline{Y}_{OF} = \frac{1}{R_{L0F}} + j \cdot \omega \cdot C_{0F} = \frac{1}{R_{L0F}} + j \cdot \frac{1}{X_{C0F}}, \quad \text{(Eq. 8)}$$

where
$R_{L0F}$=Resistance representing the leakage losses of the electric line
$X_{C0F}$=Phase-to-earth capacitive reactance of the electric line Parameter $X_{C0F}$ can be calculated based on phase-to-earth capacitances of the electric line:

$$X_{C0F} = \frac{1}{j \cdot \omega \cdot C_{0F}},$$

where $C_{0F}$=total phase-to-earth capacitance per phase of the electric line.

If the magnitude of the earth fault current of the electric line $I_{ef}$ is known, the corresponding earth capacitance per phase can be calculated using equation:

$$C_{0F} = \frac{I_{ef}}{3 \cdot \omega \cdot U_V},$$

where $U_V$=magnitude of phase-to-ground voltage

The exact value for parameter $R_{L0F}$ is typically unknown, but based on field recordings, an approximation of 10 . . . 30·$X_{C0F}$ can be used. As $Y_{OF}$ is always dominantly capacitive, the knowledge of exact value of $R_{L0F}$ is not essential.

Alternatively, the value of $\underline{Y}_{0F}$ can be determined by measurements:

$$\underline{Y}_{0F} = \frac{\Delta \underline{I}_0}{\Delta \underline{U}_0} \quad \text{(Eq. 9)}$$

where $\Delta \underline{I}_0 = (\underline{I}_{0fault} - \underline{I}_{0prefault})$=a delta quantity for a measured zero sequence current component at the measuring point $\Delta \underline{U}_0 = (\underline{U}_{0fault} - \underline{U}_{0prefault})$=a delta quantity for a measured zero sequence voltage component at the measuring point The measurement of (eq. 9) can be conducted whenever an earth fault occurs outside the electric line. Note, however, that the calculated values match the current switching state of the feeder and thus if the switching state of the protected feeder changes, then the values are no longer valid. In this case, the measurement should preferably be repeated.

The value for $Y_{OBG}$ can be determined by using the measured zero sequence quantities during a single-phase earth fault on the electric line:

$$\underline{Y}_{0BG} = -\frac{\Delta \underline{I}_0}{\Delta \underline{U}_0} \quad \text{(Eq. 10)}$$

The value of $Y_{OBG}$ describes the properties of the background network. The reactive part is proportional to the magnitude of fault current and the resistive part describes the magnitude of resistive leakage losses.

As steady-state asymmetry in zero sequence current is typically negligible, delta quantity is not absolutely required with zero sequence current in equations (Eq. 9) and (Eq. 10). However, the unbalance in phase-to-earth capacitances of individual phases creates steady-state zero-sequence voltage, which should be eliminated by using delta quantities in high impedance earthed networks.

The fault distance is preferably calculated based on pre-fault and fault values of voltages and currents. The use of such delta-quantities is not crucial, however. The voltages and currents are preferably selected as follows:

$\underline{U}_1 = \underline{U}_1$
$\underline{U}_2 = \underline{U}_2$
$\underline{U}_0 = \underline{U}_0$
$\underline{I}_1 = \underline{I}_1$
$\underline{I}_2 = \Delta \underline{I}_2$
$\underline{I}_0 = \Delta \underline{I}_0$
$\underline{I}_F = \Delta \underline{I}_F$
$\underline{I}_{0Fd} = \Delta \underline{I}_{0Fd}$ where $\Delta$=pre-fault value−fault value.

As steady-state asymmetry in the zero sequence current is typically negligible, delta quantity is not absolutely required with zero sequence current. Also the negative sequence current quantity could be calculated without delta quantity, especially if steady-state negative sequence current is small (i.e. load is not greatly unbalanced). Thus, quantities $\Delta \underline{I}_0$ and/or $\Delta \underline{I}_2$ could be replaced with $\underline{I}_0$ and/or $\underline{I}_2$, respectively.

The previous equations assumed an earth fault condition in phase L1. If the fault occurs in phase L2 or L3, the positive and negative sequence components should be phase-adjusted. This can be done based on the well-known theory of symmetrical components. Taken phase L1 as preference:

L1: $\underline{U}_2 = \underline{U}_2 \ \underline{I}_2 = \underline{I}_2 \ \underline{U}_1 = \underline{U}_1 \ \underline{I}_1 = \underline{I}_1$
L2: $\underline{U}_2 = a \cdot \underline{U}_2 \ \underline{I}_2 = a \cdot \underline{I}_2 \ \underline{U}_1 = a^2 \cdot \underline{U}_1 \ \underline{I}_1 = a^2 \cdot \underline{I}_1$
L3: $\underline{U}_2 = a^2 \cdot \underline{U}_2 \ \underline{I}_2 = a^2 \cdot \underline{I}_2 \ \underline{U}_1 = a \cdot \underline{U}_1 \ \underline{I}_1 = a \cdot \underline{I}_1$ After the calculations, the resulting fault distance line has the following co-ordinates in (d, s)-domain:

$$s = 0, \ d = \{d(s=0)\}$$

$$s = 1, \ d = \{d(s=1)\} \quad \text{(Eq. 11)}$$

According to another embodiment, the determination of the ELDC of the electric line can be performed by conduction of two earth fault tests [$R_F$ preferably 0 ohm] at the same distance from the measuring point but with different ratios of fault and load current magnitude and determining corresponding two fault distance lines using Eq. 11 above and their intersection point.

The change in the ratio of fault and load current magnitude can be achieved e.g. with some manual or automatic switching operations in the background network e.g. during the dead-time of a delayed auto-reclosing sequence. When the resulting two test fault distance lines are superimposed in (d, s)-domain, the intersection point of these two lines is located at fault distance d and the value in s-axis corresponds to a value in the ELDC and can be determined (e.g. visually or by calculations). By conducting such tests in two or more places along the electric line, i.e. by each time varying the distance from the measuring point at which the two fault tests are conducted, the ELDC for the feeder can be composed of a set of determined intersection points. The tests should preferably be conducted at several locations in order to get more points and thus a more accurate ELDC.

Figure 6:
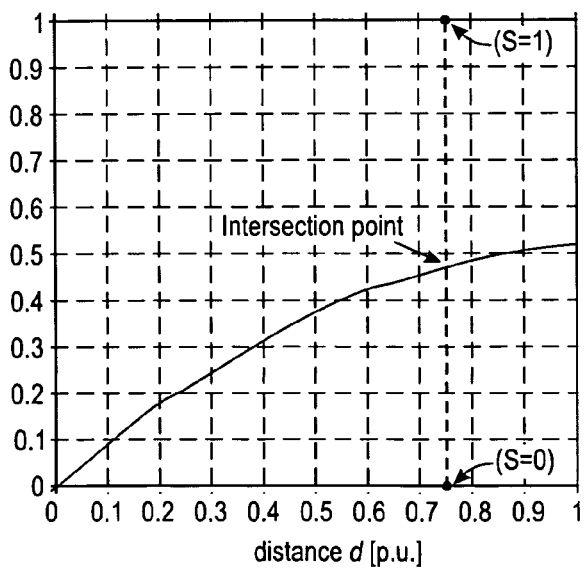
FIG. 6 is an example of an equivalent load distance curve of an electric line and a fault distance line superimposed.

The fault distance line can be plotted in the (d, s)-domain between the two co-ordinates obtained as illustrated in FIG. 6, which also shows the ELDC. The fault distance line and the ELDC are thus superimposed in the (d, s)-domain. According to an embodiment of the invention, the distance at which the ELDC and the fault distance line intersect (i.e. the d-co-ordinate of the intersection point between the ELDC and the fault distance line of Eq. 11) when superimposed is determined and the determined distance is then selected as the distance between the measuring point and the point of fault. In the example illustrated in FIG. 6, the resulting estimate for the distance between the measuring point and the point of fault is approximately 0.75.

The intersection point between the ELDC and the fault distance line can be found either by visual inspection from a figure or by calculation. The visual determination of the intersection point and thus the distance between the measuring point and the point of fault can be made when the ELDC and the fault distance line are represented graphically. The calculation of the intersection point requires that the ELDC and the fault distance line are represented with one or more equations. The ELDC could be represented e.g. as a piecewise linear function or some other type of function (e.g. exponential function), as long as the selected function gives a good fit to the ELDC points. In its simplest form the curve could be presented with two line equations (piecewise linear model) fitted with ELDC data. Such simple presentation could be used when the method is applied to a relay terminal, for example. The more accurate the representation of the true ELDC is, the more accurate results can be obtained. An apparatus implementing the method of the invention could only output the ELDC and the fault distance line, whereby the user of such apparatus would perform the actual determination of the distance between the measuring point and the point of fault on the basis of the outputted information. In this case the ELDC and the fault distance line can be outputted to a display screen, a printer or memory means, for example. It should also be noted that the ELDC and/or the fault distance line can be defined as continuous or discrete. For example, the ELDC can be defined by means of a discrete set of points. The fault location accuracy is improved, the more points is used for defining the ELDC.

Figure 7:
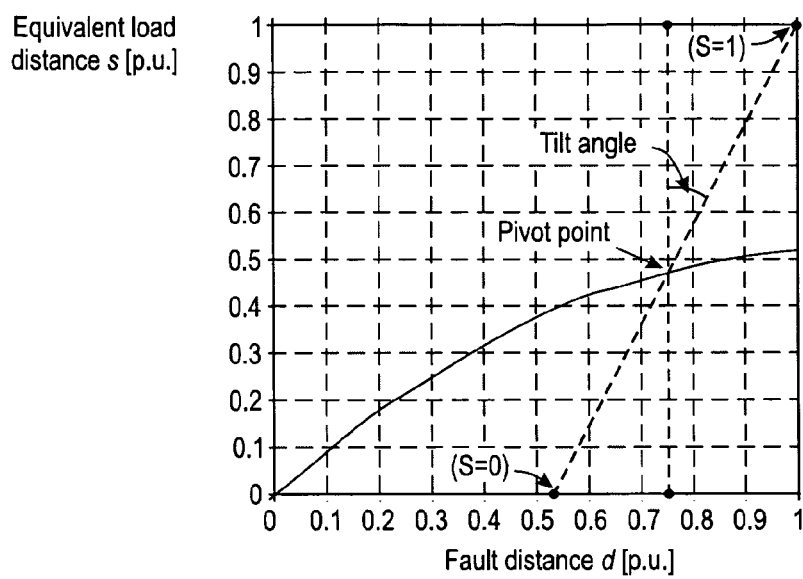
FIG. 7 illustrates fault distance line tilting.

In ideal no-load conditions, the co-ordinates for the fault distance line from Eq. 11 result in a vertical line intersecting the ELDC at fault distance d. However, as illustrated in FIG. 7, the fault distance line tilts as a function of the ratio between fault and load current magnitudes. In case of no-load it is a vertical line, but load tilts it clock-wise. The pivot point is the intersection point between the ELDC and the line of Eq. 11. The tilt angle can be used as a result validity indicator; the validity of the distance estimate deteriorates with increased tilt angle. Fault resistance is a source for error in fault location. In the (d, s)-domain it shifts the fault distance line and thus the interception point and deteriorates fault distance estimate. Higher fault resistance will also tilt the line anti-clockwise. The solution provided by the invention is visual and very illustrative for the end user. The fault distance and factors affecting the validity (tilt angle) can be seen directly from the graphical solution. Together with an estimate of the fault resistance, reliable validity estimation can be made. The graphical solution also gives possibility to take the actual feeder voltage drop profile into consideration, which was not possible with prior-art algorithms.

It is also possible to repeat the above-described determination of the distance between the measuring point and the point of fault for one or more times such that e.g. the switching state of the electric system or the degree of compensation of earth fault current is different each time. Thus two or more alternative estimates for the fault distance are obtained whereby it is possible to judge which estimate is the most reliable one on the basis of e.g. the ratio of fault and load current magnitudes.

When the electric line has laterals, then multiple fault locations are possible because the fault distance line may intersect e.g. the main branch and one lateral of the ELDC. In that case the correct fault location can be found utilizing other system data, e.g. information from fault indicators located at branching points.

An apparatus according to an embodiment of the invention may be implemented such that it comprises a calculation unit which determines the ELDC of the electric line and the fault distance line as described above. Such a calculation unit may additionally be configured to determine the distance between the measuring point and the point of fault. The apparatus may further comprise a detection unit which detects a fault on the electric line and/or an identification unit, which identifies a faulted phase or phases of the electric line. Here the term 'unit' refers generally to a physical or logical entity, such as a physical device or a part thereof or a software routine. The other embodiments of the invention described above may be implemented e.g. with the calculation unit or one or more additional units. The above-mentioned detection, identification and calculation units and possible additional units may be physically separate units or implemented as one entity. One or more of these units may reside in the protective relay unit 40 of FIG. 1, for example. When the fault detection and/or identification of the faulted phase are performed by a separate unit or units which are possibly already present in the system to be protected, the invention can be implemented with an apparatus which receives the fault detection information and indication of the faulted phase from such units.

An apparatus according to any one of the embodiments of the invention can be implemented by means of a computer or corresponding digital signal processing equipment with suitable software therein, for example. Such a computer or digital signal processing equipment preferably comprises at least a memory providing storage area used for arithmetical operations and a processor, such as a general-purpose digital signal processor (DSP), for executing the arithmetical operations. It is also possible to use a specific integrated circuit or circuits, or corresponding components and devices for implementing the functionality according to any one of the embodiments of the invention.

The invention can be implemented in existing system elements, such as various protective relays or relay arrangements, in a distribution management system (DMS), or by using separate dedicated elements or devices in a centralized or distributed manner. Present protective devices for electric systems, such as protective relays, typically comprise processors and memory that can be utilized in the functions according to embodiments of the invention. Thus, all modifications and configurations required for implementing an embodiment of the invention e.g. in existing protective devices may be performed as software routines, which may be implemented as added or updated software routines. If the functionality of the invention is implemented by software, such software can be provided as a computer program product comprising computer program code which, when run on a computer, causes the computer or corresponding arrangement to perform the functionality according to the invention as described above. Such a computer program code can be stored on a computer readable medium, such as suitable memory means, e.g. a flash memory or a disc memory from which it is loadable to the unit or units executing the program code. In addition, such a computer program code implementing the invention can be loaded to the unit or units executing the computer program code via a suitable data network, for example, and it can replace or update a possibly existing program code.

It will be obvious to a person skilled in the art that, as the technology advances, the inventive concept can be implemented in various ways. The invention and its embodiments are not limited to the examples described above but may vary within the scope of the claims.

The invention claimed is:

1. A method for determining a location of a phase-to-earth fault on a three-phase electric line of an electric network, the method comprising:
   monitoring current and voltage quantities of the three-phase electric line at a measuring point;
   determining an equivalent load distance curve of the electric line representing a voltage drop along the electric line in relation to a distance from the measuring point which voltage drop is scaled by an equivalent load distance of the electric line which indicates a distance of an equivalent load point from the measuring point which equivalent load point equals to a total load of the electric line modelled to be concentrated in a single point of the electric line;
   determining, after a fault occurs in the three-phase electric line, a fault distance line which indicates an estimate of the distance of the fault from the measuring point in relation to the equivalent load distance on the basis of values of the monitored current and voltage quantities during the fault and an equation which relates the monitored current and voltage quantities to the fault distance;
   determining a distance from the measuring point at which the equivalent load distance curve and the fault distance line intersect when superimposed; and
   selecting the determined distance as the distance between the measuring point and the point of fault.

2. The method according to claim 1, wherein the determination of the equivalent load distance curve of the electric line comprises:
   determining a voltage drop curve of the electric line which indicates a voltage drop on the electric line in relation to a distance from the measuring point;
   determining the equivalent load distance of the electric line; and
   determining the equivalent load distance curve by multiplying the voltage drop curve by the equivalent load distance.

3. The method according to claim 2, wherein the voltage drop is represented in per unit values.

4. The method according to claim 1, wherein the determination of the equivalent load distance curve of the electric line comprises:
   a) conducting an earth fault test at a known distance from the measuring point;
   b) determining an equivalent load distance corresponding to the known fault distance on the basis of values of the monitored current and voltage quantities during the earth fault test and an equation which relates the monitored current and voltage quantities to the equivalent load distance, wherein the pair of fault distance and the determined corresponding equivalent load distance defines a point;
   repeating steps a) and b) one or more times such that the distance from the measuring point at which the earth fault test is conducted is varied each time; and
   determining the equivalent load distance curve by the set of points obtained in step b).

5. The method according to claim 1, wherein the determination of the equivalent load distance curve of the electric line comprises:
   c) conducting a first earth fault test with a ratio of a fault current and load current having a first value;
   d) determining a first test fault distance line which indicates an estimate of a distance of the fault from the measuring point in relation to the equivalent load distance on the basis of values of the monitored current and voltage quantities during the first earth fault test and an equation which relates the monitored current and voltage quantities to the fault distance;
   e) conducting a second earth fault test at the same distance from the measuring point as the first earth fault test with a ratio of the fault current and load current having a second value different from the first value;
   f) determining a second test fault distance line which indicates an estimate of a distance of the fault from the measuring point in relation to the equivalent load distance on the basis of values of the monitored current and voltage quantities during the second earth fault test and an equation which relates the monitored current and voltage quantities to the fault distance;
   g) determining a point at which the first and second test fault distance lines intersect when superimposed;
   repeating steps c) to g) one or more times such that the distance from the measuring point at which the first and second earth fault tests are conducted is varied each time; and
   determining the equivalent load distance curve by the set of determined intersection points obtained in step g).

6. The method according to claim 1, wherein the equivalent load distance curve of the electric line and the fault distance line are represented graphically.

7. The method according to claim 6, wherein the determination of the distance at which the equivalent load distance curve and the fault distance line intersect is performed visually.

8. The method according to claim 1, wherein the equivalent load distance curve of the electric line and the fault distance line are represented by one or more equations.

9. A computer program product comprising computer program code, wherein the execution of the program code in a computer causes the computer to carry out the steps of the method according to claim 1.

10. An apparatus for use in localization of a phase-to-earth fault on a three-phase electric line of an electric network, the apparatus comprising:
   means for monitoring current and voltage quantities of the three-phase electric line at a measuring point;
   means for determining an equivalent load distance curve of the electric line representing a voltage drop along the electric line in relation to a distance from the measuring point, which voltage drop is scaled by an equivalent load distance of the electric line which indicates a distance of an equivalent load point from the measuring point, which equivalent load point equals to a total load of the electric line modelled to be concentrated in a single point of the electric line; and
   means for determining, after a fault occurs in the three-phase electric line, a fault distance line which indicates an estimate of the distance of the fault from the measuring point in relation to the equivalent load distance on the basis of values of the monitored current and voltage quantities and an equation which relates the monitored current and voltage quantities to the fault distance.

11. The apparatus as claimed in claim 10, comprising:
means for determining a fault on the three-phase electric line and a faulted phase of the three-phase electric line.

12. The apparatus as claimed in claim 10 comprising:
means for determining a distance from the measuring point at which the equivalent load distance curve and the fault distance line intersect when superimposed; and
means for selecting the determined distance as the distance between the measuring point- and the point of fault.

13. The apparatus as claimed in claim 10 comprising:
means for outputting the determined equivalent load distance curve of the electric line and the fault distance line.

14. The apparatus as claimed in claim 13, comprising:
means for outputting the determined equivalent load distance curve of the electric line and the fault distance line in a graphical form.

15. The apparatus as claimed in claim 13 comprising:
means for outputting the determined equivalent load distance curve of the electric line and the fault distance line mutually superimposed.

16. The apparatus as claimed in claim 10, wherein the means for determining the equivalent load distance curve of the electric line are configured to:
determine a voltage drop curve of the electric line which indicates a voltage drop on the electric line in relation to a distance from the measuring point;
determine the equivalent load distance of the electric line; and
determine the equivalent load distance curve by multiplying the voltage drop curve with the equivalent load distance.

17. The apparatus as claimed in claim 10, wherein the means for determining the equivalent load distance curve of the electric line are configured to:
determine, in connection with an earth fault test at a known distance from the measuring point, an equivalent load distance corresponding to the known fault distance on the basis of values of the monitored current and voltage quantities during the earth fault test and an equation which relates the monitored current and voltage quantities to the equivalent load distance, wherein the pair of fault distance and the determined corresponding equivalent load distance defines a point;
repeat the previous step one or more times such that the distance from the measuring point at which the earth fault test takes place is different each time; and
determine the equivalent load distance curve by the set of points obtained.

18. The apparatus as claimed in claim 10, wherein the means for determining the equivalent load distance curve of the electric line are configured to:
1) determine, in connection with a first earth fault test with a ratio of a fault current and load current having a first value, a first test fault distance line which indicates an estimate of a distance of the fault from the measuring point in relation to the equivalent load distance on the basis of values of the monitored current and voltage quantities during the first earth fault test and an equation which relates the monitored current and voltage quantities to the fault distance;
2) determine, in connection with a second earth fault test at the same distance from the measuring point as the first earth fault test with a ratio of the fault current and load current having a second value, which is different from the first value, a second test fault distance line which indicates an estimate of a distance of the fault from the measuring point in relation to the equivalent load distance on the basis of values of the monitored current and voltage quantities during the second earth fault test and an equation which relates the monitored current and voltage quantities to the fault distance;
3) determine a point at which the first and second test fault distance lines intersect when superimposed;
repeat steps 1) to 3) one or more times such that the distance from the measuring point at which the first and second earth fault tests occur is different each time; and
determine the equivalent load distance curve by the set of determined intersection points obtained in step 3).

19. The apparatus as claimed in claim 10, wherein the apparatus is a protective relay.

* * * * *